(12) United States Patent
Hayakawa et al.

(10) Patent No.: US 10,431,722 B2
(45) Date of Patent: Oct. 1, 2019

(54) LIGHT EMITTING ELEMENT, LIGHT EMITTING ELEMENT ARRAY, AND LIGHT TRANSMISSION DEVICE

(71) Applicant: FUJI XEROX CO., LTD., Tokyo (JP)

(72) Inventors: Junichiro Hayakawa, Kanagawa (JP); Akemi Murakami, Kanagawa (JP); Takashi Kondo, Kanagawa (JP); Naoki Jogan, Kanagawa (JP); Jun Sakurai, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 69 days.

(21) Appl. No.: 15/587,709

(22) Filed: May 5, 2017

(65) Prior Publication Data

US 2018/0047882 A1 Feb. 15, 2018

(30) Foreign Application Priority Data

Aug. 10, 2016 (JP) .................................. 2016-157998

(51) Int. Cl.
| | |
|---|---|
| *H01L 33/60* | (2010.01) |
| *H01L 25/16* | (2006.01) |
| *H01L 31/12* | (2006.01) |
| *H01L 27/15* | (2006.01) |
| *H01L 33/40* | (2010.01) |
| *H01L 33/62* | (2010.01) |

(52) U.S. Cl.
CPC ............. *H01L 33/60* (2013.01); *H01L 25/167* (2013.01); *H01L 27/15* (2013.01); *H01L 27/156* (2013.01); *H01L 31/125* (2013.01); *H01L 33/405* (2013.01); *H01L 33/62* (2013.01)

(58) Field of Classification Search
None
See application file for complete search history.

(56) References Cited

U.S. PATENT DOCUMENTS

| | | | | | |
|---|---|---|---|---|---|
| 4,297,653 | A | * | 10/1981 | Scifres ................. | G02B 6/4204 257/E27.12 |
| 4,675,518 | A | * | 6/1987 | Oimura .................... | H03K 3/42 250/205 |
| 4,771,434 | A | * | 9/1988 | Yoshida ................ | H01S 5/0264 257/446 |
| 5,285,466 | A | * | 2/1994 | Tabatabaie ............ | H01S 5/0264 257/80 |
| 5,404,373 | A | * | 4/1995 | Cheng ....................... | G06E 1/04 257/E31.102 |
| 5,799,030 | A | * | 8/1998 | Brenner .............. | H01S 5/18308 372/50.21 |

(Continued)

FOREIGN PATENT DOCUMENTS

JP 2006-140189 A 6/2006

*Primary Examiner* — Andres Munoz
(74) *Attorney, Agent, or Firm* — Sughrue Mion, PLLC (57) ABSTRACT

A light emitting element includes:
  a semiconductor stack structure that includes
    a light emitting part, and
    a light receiving part that receives light propagating in a lateral direction through a semiconductor layer from the light emitting part, wherein the light emitting part and the light receiving part share a quantum layer; and
  a light reflection layer that covers ⅓ or more of a lateral surface of the quantum layer in the light receiving part.

18 Claims, 6 Drawing Sheets

(56) References Cited

U.S. PATENT DOCUMENTS

| | | | |
|---|---|---|---|
| 7,305,018 B2 * | 12/2007 | Otoma | B82Y 20/00 372/43.01 |
| 7,529,284 B2 * | 5/2009 | Karnutsch | H01S 5/18316 372/50.124 |
| 7,558,489 B2 * | 7/2009 | Guenter | H04B 10/077 398/140 |
| 8,488,645 B2 * | 7/2013 | Murty | H01S 5/183 372/43.01 |
| 8,592,236 B2 * | 11/2013 | Albrecht | B82Y 20/00 359/344 |

\* cited by examiner

FIG.6B

LIGHT EMITTING ELEMENT, LIGHT EMITTING ELEMENT ARRAY, AND LIGHT TRANSMISSION DEVICE

CROSS-REFERENCE TO RELATED APPLICATIONS

This application is based on and claims priority under 35 USC 119 from Japanese Patent Application No. 2016-157998 filed Aug. 10, 2016.

BACKGROUND

The present invention relates to a light emitting element, a light emitting element array, and a light transmission device.

SUMMARY

According to an aspect of the invention, alight emitting element includes:
a semiconductor stack structure that includes
a light emitting part, and
a light receiving part that receives light propagating in a lateral direction through a semiconductor layer from the light emitting part, wherein the light emitting part and the light receiving part share a quantum layer; and
a light reflection layer that covers 1/3 or more of a lateral surface of the quantum layer in the light receiving part.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present invention will be described in detail with reference to the drawings. A light emitting element according to the present exemplary embodiment is a monitor PD integrated light emitting element in which a monitor photodiode (hereinafter, referred to as a "monitor PD") is integrated to receive a part of an optical output from a light emitting part.

First Exemplary Embodiment

Figure 1A:
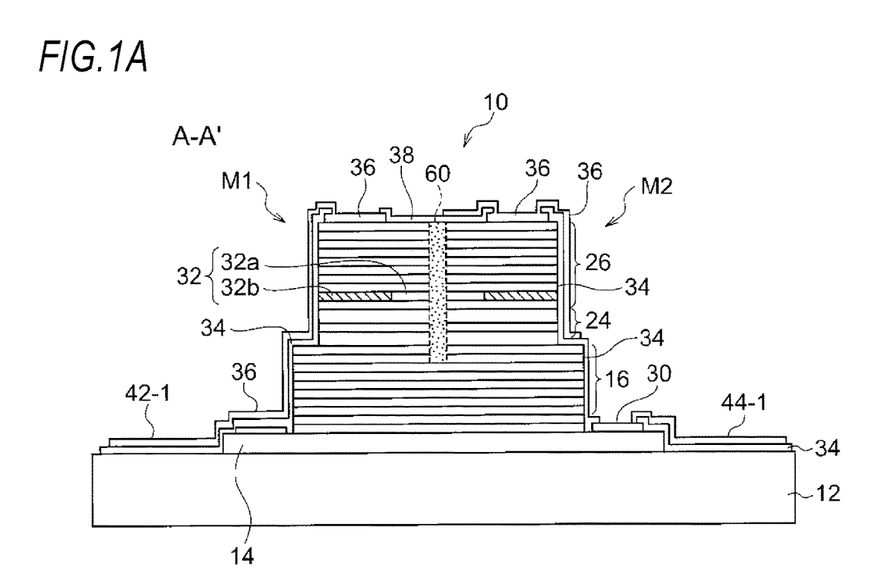
FIGS. 1A and 1B are a cross-sectional view and a top plan view illustrating an exemplary configuration of a light emitting element according to a first exemplary embodiment.
Figure 1B:
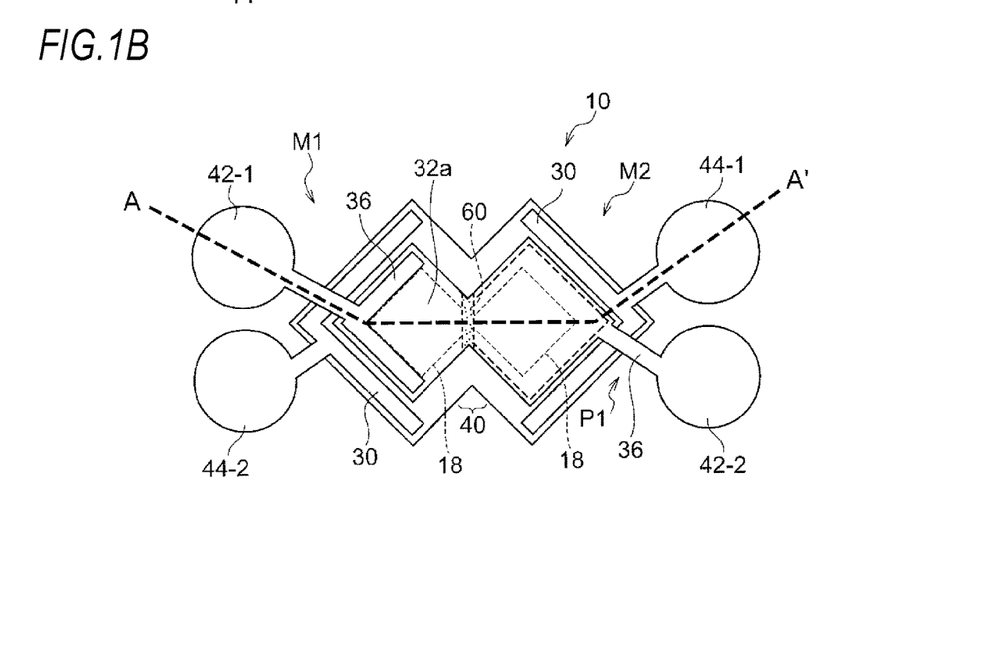

An exemplary configuration of a light emitting element 10 according to the present exemplary embodiment will be described with reference to FIGS. 1A and 1B. In the present exemplary embodiment, descriptions will be made while exemplifying an aspect in which a light emitting element according to the present invention is applied to a VCSEL (vertical cavity surface emitting laser). FIG. 1A is a cross-sectional view of a light emitting element 10 according to the present exemplary embodiment, and FIG. 1B is a top plan view of the light emitting element 10. The cross-sectional view illustrated in FIG. 1A is a cross-sectional view taken along line A-A' in the top plan view illustrated in FIG. 1B.

As illustrated in FIG. 1A, the light emitting element 10 includes an n-type GaAs contact layer 14, a lower DBR (distributed Bragg reflector) 16, an active region 24, an oxide confinement layer 32, and an upper DBR 26 which are formed on a semi-insulating GaAs (gallium arsenic) substrate 12.

As illustrated in FIG. 1B, the light emitting element 10 has two mesas (columnar structure), that is, a mesa M1 and a mesa M2 each having a substantially rectangular shape, and has a coupling portion 40 at a portion where the mesa M1 and the mesa M2 are connected to each other. The coupling portion 40 according to the present exemplary embodiment is provided at a narrow portion of a semiconductor layer which is formed as the mesa M1 and the mesa M2 are connected to each other. Each of the mesa M1 and the mesa M2 includes the lower DBR 16, the active region 24, the oxide confinement layer 32, and the upper DBR 26 which are formed in common on the contact layer 14.

In addition, a current blocking region 60, which is formed in the upper DBR 26, is disposed between the mesa M1 and the mesa M2, that is, in the coupling portion 40. A current blocking region 60 according to the present exemplary embodiment is a high resistance region which is formed from the upper surfaces of the mesas M1 and M2 to the oxide confinement layer 32 (i.e., to a depth that does not reach the active region 24) by, for example, implanting $H^+$ (proton) ions. The current blocking region 60 electrically separates the mesa M1 and the mesa M2 from each other. As described below, in the light emitting element 10 according to the present exemplary embodiment, the mesa M1 constitutes a light emitting part (VCSEL), and the mesa M2 constitutes a light receiving part (monitor PD (photodiode)) that receives an optical output from the light emitting part. Hereinafter, the entire structure configured with the mesa M1 and the mesa M2 will be referred to as a mesa M.

Further, the current blocking region 60 serves to improve the detecting precision of the optical output (improve an S/N (signal to noise) ratio) by at least partially and electrically separating the light emitting part and the light receiving part. It should be noted that the current blocking region 60 is not essential. That is, the current blocking region 60 may not to be used depending on an acceptable degree for detecting precision.

As illustrated in FIG. 1A, an interlayer insulating film as an inorganic insulating film is deposited on the circumference of the semiconductor layer including the mesa M. The interlayer insulating film 34 extends from a lateral surface of the mesa M to a surface of the substrate 12, and is disposed under a p-side electrode pad 42-1 and an n-side electrode pad 44-1. The interlayer insulating film 34 according to the present exemplary embodiment is formed of, for example, a silicon nitride film (SiN film). The material of the interlayer insulating film 34 is not limited to the silicon nitride film, but may be, for example, a silicon oxide film ($SiO_2$ film), a silicon oxynitride film (SiON film), or the like.

As illustrated in FIG. 1A, a p-side electrode wiring 36 is provided through an opening of the interlayer insulating film 34. A contact layer (not illustrated) is provided on the uppermost layer of the upper DBR 26 so as to be connected with the p-side electrode wiring 36, and one end side of the p-side electrode wiring 36 is connected to the upper DBR 26 through the contact layer so that an ohmic contact is formed between the p-side electrode wiring 36 and the upper DBR 26. As illustrated in FIGS. 1A and 1B, in the present exemplary embodiment, a lateral surface and a light receiving surface (a surface on which an emission surface protective layer 38 to be described below is provided (an upper surface)) of a light receiving part (mesa M2) are covered by a p-side electrode wiring 36. The other end side of the p-side electrode wiring 36 extends from the lateral surface of the mesa M to the surface of the substrate 12, and constitutes the p-side electrode pad 42-1. The p-side electrode wiring 36 is formed by, for example, depositing a stacked film of Ti (titanium)/Au (gold). Hereinafter, the p-side electrode pad 42-1 and a p-side electrode pad 42-2 (see FIG. 1B) will be collectively referred to as a "p-side electrode pad 42." In the light emitting element 10, a p-side electrode constitutes an anode electrode.

Similarly, an n-side electrode wiring 30 is provided through an opening of the interlayer insulating film 34. One end side of the n-side electrode wiring 30 is connected to the contact layer 14 so that an ohmic contact is formed between the n-side electrode wiring 30 and the contact layer 14. Meanwhile, the other end side of the n-side electrode wiring 30 extends to the surface of the substrate 12, and forms the n-side electrode pad 44-1 as illustrated in FIG. 1A. The n-side electrode wiring 30 is formed by, for example, depositing a stacked film of AuGe/Ni/Au. Hereinafter, the n-side electrode pad 44-1 and an n-side electrode pad 44-2 (see FIG. 1B) will be collectively referred to as an "n-side electrode pad 44." In the light emitting element 10, an n-side electrode constitutes a cathode electrode.

As described above, for example, a semi-insulating GaAs substrate is used as the substrate 12 according to the present exemplary embodiment. The semi-insulating GaAs substrate refers to a GaAs substrate which is not doped with impurity. The semi-insulating GaAs substrate has a very high resistivity, and a sheet resistance value thereof is about several megohms (MΩ).

The contact layer 14 formed on the substrate 12 is formed by, for example, a GaAs layer that is doped with Si. One end of the contact layer 14 is connected to the n-type lower DBR 16, and the other end of the contact layer 14 is connected to the n-side electrode wiring 30. That is, the contact layer 14 is interposed between the lower DBR 16 and the n-side electrode wiring 30, and serves to provide a constant electric potential to the semiconductor layer including the mesa M. The contact layer 14 may also serve as a buffer layer provided to improve the crystallinity of the surface of the substrate after thermal cleaning.

Assuming that the oscillation wavelength of the light emitting element 10 is λ and the refractive index of a medium (semiconductor layer) is n, the n-type lower DBR 16 formed on the contact layer 14 is a multilayer reflection mirror configured by repeatedly and alternately stacking two semiconductor layers each of which have a film thickness of 0.25 λ/n. The two semiconductor layers have different refractive indexes. Specifically, the lower DBR 16 is configured by repeatedly and alternately stacking an n-type low refractive index layer made of $Al_{0.90}Ga_{0.1}As$ and an n-type high refractive index layer made of $Al_{0.15}Ga_{0.85}As$. In the light emitting element 10 according to the present exemplary embodiment, the oscillation wavelength λ is, for example, 850 nm.

The active region 24 according to the present exemplary embodiment may include, for example, a lower spacer layer, a quantum well active layer, and an upper spacer layer (not illustrated). The quantum well active layer according to the present exemplary embodiment may include, for example, four barrier layers made of $Al_{0.3}Ga_{0.7}As$ and three quantum well layers made of GaAs and provided between the barrier layers. In addition, by being disposed between the quantum well active layer and the lower DBR 16 and between the quantum well active layer and the upper DBR 26, respectively, the lower spacer layer and the upper spacer layer also serve to adjust the length of a resonator, and serve as clad layers for confining a carrier. In the light emitting element 10, since the mesa M1 constitutes the VCSEL, the active region 24 in the mesa M1 constitutes a light emitting layer, and the mesa M2 constitutes the monitor PD, the active region 24 in the mesa M2 substantially serves as a light absorbing layer.

The p-type oxide confinement layer 32 provided on the active region 24 is a current confinement layer, and includes a non-oxidized region 32a and an oxidized region 32b. The current, which flows from the p-side electrode pad 42-1 to the n-side electrode pad 44-2, is throttled by the non-oxidized region 32a. A boundary 18 illustrated in FIG. 1B represents a boundary between the non-oxidized region 32a and the oxidized region 32b. As illustrated in FIG. 1B, the non-oxidized region 32a according to the present exemplary embodiment, which is defined by the boundary 18, has a narrow shape in the coupling portion 40.

The upper DBR 26 formed on the oxide confinement layer 32 is a multilayer reflection mirror configured by repeatedly and alternately stacking two semiconductor layers each of which has a film thickness of 0.25 λ/n. The two semiconductor layers have different refractive indexes. Specifically, the upper DBR 26 is configured by repeatedly and alternately stacking a p-type low refractive index layer of $Al_{0.90}Ga_{0.1}As$ and a p-type high refractive index layer of $Al_{0.15}Ga_{0.85}As$.

An emission surface protective layer 38 is provided on the upper DBR 26 to protect a light emission surface. For example, the emission surface protective layer 38 is formed by depositing a silicon nitride film.

By the way, the light emitting element (VCSEL) takes out a laser output in a direction perpendicular to the substrate, and is easily configured as an array by 2-dimensional integration, and thus the light emitting element (VCSEL) is used as a writing light source for an electrophotographic system or a light source for optical communication.

The VCSEL includes a pair of distributed Bragg reflectors (the lower DBR 16 and the upper DBR 26) provided on the semiconductor substrate (substrate 12), and an active region (the active region 24 including the active layer, the lower spacer layer, and the upper spacer layer) provided between the pair of distributed Bragg reflectors. The light emitting device is configured such that a current is applied to the active layer by the electrodes (the p-side electrode wiring 36 and the n-side electrode wiring 30) provided at the opposite sides of the distributed Bragg reflector, and laser oscillation occurs in a direction perpendicular to the surface of the substrate such that the oscillated light is emitted from the upper portion of an element (the surface side of the emission surface protective layer 38).

Meanwhile, the semiconductor laser (not limited to the VCSEL) is required to be stabilized in some cases so that the optical output is not changed in accompany with a change in temperature or a change in power source. As a method for the stabilization, there is an automatic power control (APC) method. The APC method refers to a method of detecting an optical output of the semiconductor laser as a monitor current by using the monitor PD and the like, obtaining a difference value by comparing the detected monitor current with a reference value, and performing a negative feedback control on the optical output of the semiconductor laser by converting a driving current by using the differential value.

Due to the reason that the semiconductor laser and the monitor PD are made of different semiconductor materials, it is difficult to implement a monolithic integration in many cases. In this case, the monitor PD is provided outside the semiconductor laser. Accordingly, if the semiconductor laser and the monitor PD are capable of being integrated with each other in a monolithic manner, the number of components may be reduced. Further, it is also desirable in terms of a stable operation since noise or the like may hardly affect the semiconductor laser and the monitor PD.

As the VCSEL in the related art in which a monitor PD integrated is in a monolithic manner, there is known a VCSEL which has the monitor PD formed on the light emission surface, and monitors an optical output emitted from the light emission surface. The monitor PD of the VCSEL in the related art is formed of Si (silicon) on a dielectric DBR.

However, in the VCSEL in the related art, the monitor PD needs to be formed on the emission surface by using a material different from a material of a main body, and as a result, a structure or a manufacturing process thereof is complicated. Since there is projection light which is projected from the VCSEL and absorbed by the monitor PD without contributing to the light reception, the light emitting efficiency of the VCSEL deteriorates.

Therefore, the VCSEL according to the present exemplary embodiment adopts a configuration in which the VCSEL and the monitor PD are formed on the same substrate, and the VCSEL and the monitor PD are coupled to each other through a semiconductor layer identical to the VCSEL or the monitor PD in a direction parallel to the substrate (i.e., a direction intersecting an oscillation direction of the light emitting part (hereinafter, referred to as a "lateral direction" in some cases)). That is, the monitor PD of the light emitting element 10 according to the present exemplary embodiment receives leaking light (propagating light) propagated from the VCSEL in the lateral direction. By adopting the aforementioned structure, deterioration in light emitting efficiency of the VCSEL is prevented with a simple structure, and as a result, an efficient APC control is implemented.

Here, in the VCSEL according to the present exemplary embodiment having the aforementioned configuration, light, which penetrates into the semiconductor layer (particularly, the active region) of the monitor PD from a lateral surface or an upper surface (light receiving surface) of the monitor PD, becomes a great noise source when an optical output of the VCSEL is monitored or an APC control is performed. That is, the light causes deterioration of an S/N ratio of the monitor current at the monitor PD. To improve the S/N ratio when monitoring the optical output or performing the APC control, it is important to prevent the monitor PD from receiving light other than leaking light propagated from the VCSEL in the lateral direction.

That is, in a semiconductor stack structure having a light emitting part and a light receiving part that receives light propagating in the lateral direction through the semiconductor layer from the light emitting part in which the light emitting part and the light receiving part share a quantum layer, when a lateral surface or an upper surface of the light receiving part is irradiated with light from the outside, the detection precision of light propagating through the semiconductor layer, which is to be detected primarily, may deteriorate in some cases. In particular, in a light emitting element array in which plural light emitting elements are arranged, the lateral surface of the light receiving part is easily irradiated with light emitted from another adjacent light emitting element, and it is required to prevent this. For this reason, the VCSEL (light emitting element) according to the present exemplary embodiment is provided with a light blocking unit in order to block light projected to the lateral surface of the light receiving part from the outside.

Next, a configuration of the light emitting element 10 according to the present exemplary embodiment will be described in more detail. In many cases, the VCSEL is provided with an oxide confinement layer (oxide confinement layer 32) formed by oxidizing a semiconductor layer including Al in the composition thereof from the point of view of reducing a threshold current value and controllability in a transverse mode, and the element is etched in a mesa shape and subjected to an oxidation treatment in order to oxidize the semiconductor layer including Al. Thereafter, a lateral surface having the mesa shape which is exposed by etching processing or the etched surface of the semiconductor is generally covered with an insulating material such as a silicon nitride film or a silicon oxide film.

In the light emitting element 10, a non-oxidized region 32a and an oxidized region 32b are formed by the oxidation treatment on the mesa M. The boundary 18 illustrated in FIG. 1B is a boundary between the non-oxidized region 32a and the oxidized region 32b. That is, the non-oxidized region 32a defined by the boundary 18 is formed from the mesa M1 to the mesa M2.

Since the oxidized region 32b is oxidized to have a high electrical resistance, the oxidized region 32b serves as a non-conductive region, and the current introduced from a p-side electrode pad 42-1 is confined in the non-oxidized region 32a. In addition, when a semiconductor is oxidized, a refractive index of the semiconductor is generally decreased. Therefore, the refractive index of the non-oxidized region 32a becomes larger than a refractive index of the oxidized region 32b. For this reason, the light emitted from the light emitting part is confined in the non-oxidized region 32a surrounded by the oxidized region 32b having a low refractive index. That is, the light and current are confined in the non-oxidized region 32a by the oxide confinement layer.

In the light emitting element 10, since the non-oxidized region 32a is formed from the light emitting part configured with the mesa M1 to the light receiving part configured with the mesa M2, a part of laser oscillation light generated by the light emitting part is propagated in the lateral direction (direction parallel to the substrate 12), reaches the light receiving part (monitor PD), and then is converted into a current.

As described above, in the light emitting element 10 according to the present exemplary embodiment, a coupling resonator is configured as the light emitting part configured with the mesa M1 and the light receiving part configured with the mesa M2 are optically coupling to each other, and light leaking from the light emitting part is propagated to the coupling portion 40, and detected as a monitor current by a detector connected to the light receiving part. That is, according to the light emitting element 10 of the present exemplary embodiment, a highly efficient monitor PD integrated light emitting element having a compact and simple device structure is implemented.

Figure 2A:
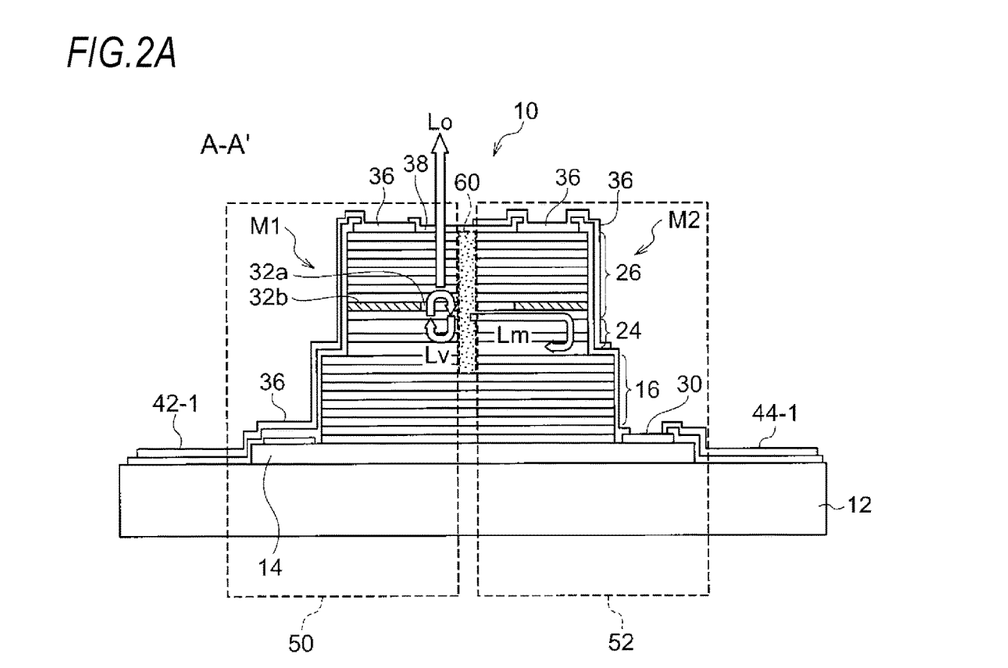
FIGS. 2A and 2B are views for explaining configurations of a light emitting part and a light receiving part of a light emitting element according to a first exemplary embodiment.

The coupling resonator according to the present exemplary embodiment will be described in more detail with reference to FIG. 2. As described above, in the light emitting element 10, a light emitting part 50 (VCSEL) is formed by the mesa M1, and a light receiving part (monitor PD) 52 is formed by the mesa M2. In the light emitting part 50, a positive pole of a power source (not illustrated) for the VCSEL is connected to the p-side electrode pad 42-1, and a negative pole thereof is connected to an n-side electrode pad 44-2 (forward bias). As a driving current is applied between the p-side electrode pad 42-1 and the n-side electrode pad 44-2, oscillation light Lv is generated by the resonator formed by the lower DBR 16 and the upper DBR 26, as illustrated in FIG. 2A. A part of the oscillation light Lv is emitted, as projection light Lo, from the emission surface protective layer 38.

As illustrated in FIG. 2A, a part of the oscillation light Lv is propagated as propagating light Lm (monitor light, leaking light) in the lateral direction. The propagating light Lm is propagated from the light emitting part 50 to the light receiving part 52 while being totally reflected by the resonator formed by the lower DBR 16 and the upper DBR 26. For this reason, a group velocity of the propagating light Lm is decreased, so that the propagating light Lm becomes so-called slow light. Meanwhile, in the light receiving part 52, a positive pole of a power source (not illustrated) for the monitor PD is connected to the n-side electrode pad 44-1, and a negative pole thereof is connected to the p-side electrode pad 42-2 (reverse bias).

As a light receiving current generated by the propagating light Lm is applied between the n-side electrode pad 44-1 and the p-side electrode pad 42-2, the optical output from the light emitting part 50 is monitored. In this case, the light absorbing layer of the light receiving part 52 also serves as the active region 24 that constitutes the light emitting part. For this reason, the light absorbing layer, which constitutes the light receiving part 52, does not necessarily have a sufficient film thickness. However, since the monitor light according to the present exemplary embodiment is the slow light as described above, a carrier is easily generated and a sufficient photocurrent is obtained even in the case where the light absorbing layer is thin. In the VCSEL according to the present exemplary embodiment, the active region (including the quantum well layer or a quantum dot layer) of the light emitting part and the light absorbing layer of the light receiving part are used in common, and as a result, both the active region and the light absorbing layer may be referred to as a "quantum layer" in some cases.

Figure 2B:
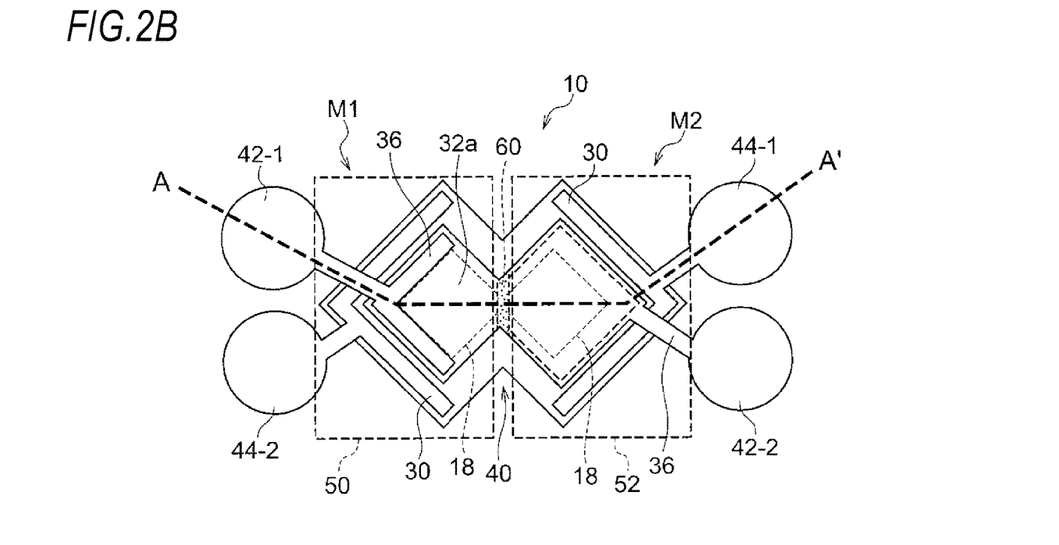

Next, an operation of the coupling portion 40 according to the present exemplary embodiment will be in more detail described. As illustrated in FIG. 2B, the non-oxidized region 32a and the oxidized region 32b are constricted in the coupling portion 40. For this reason, a width of the non-oxidized region 32a is set to be "wide," "narrow," and then "wide" from the light emitting part 50 to the light receiving part 52 illustrated in FIG. 2B.

Meanwhile, a ratio of an area of the oxidized region 32b to an area of the non-oxidized region 32a is set to be "small," "large," and then "small." Here, as described above, the refractive index of the non-oxidized region 32a is greater than that of the oxidized region 32b. As known in the related art, as a proportion of materials having a low refractive index is increased around a light waveguide, a refractive index sensed from light propagating through the light waveguide (equivalent refractive index, or effective refractive index) is decreased. For this reason, the equivalent refractive index of the non-oxidized region 32a in the coupling portion 40 is lower than the equivalent refractive index of the non-oxidized region 32a of the light emitting part 50 and the light receiving part 52 at both sides. That is, the equivalent refractive index of the non-oxidized region 32a is set to be "high," "low," and then "high" from the light emitting part 50 to the light receiving part 52. The equivalent refractive index used in the present exemplary embodiment refers to an index obtained by an equivalent refractive index method by using an effective refractive index (a refractive index of a multilayered semiconductor layer is considered as a refractive index of a single layer) of semiconductor layers which are stacked in a direction perpendicular to the substrate and have different refractive indexes.

As the light emitting element 10 has an equivalent refractive index distribution of the aforementioned configuration, the light emitted from the light emitting part 50 (VCSEL) is effectively confined in the non-oxidized region 32a, and the light (slow light) leaks from the light emitting part 50 to be received by the light receiving part 52. In a case where the equivalent refractive index of the non-oxidized region 32a is set to be "high," "high," and then "high" from the light emitting part 50 to the light receiving part 52, that is, the equivalent refractive index of the non-oxidized region 32a is set to be substantially constant, it is difficult to confine the light in the light emitting part 50. Meanwhile, in a case where the equivalent refractive index of the non-oxidized region 32a is set to be "high," "low," and then "low" from the light emitting part 50 to the light receiving part 52, the light may be confined in the light emitting part 50. However, the amount of leaking light is reduced, and for example, it is difficult to detect the monitor current, and the S/N ratio becomes worse.

In addition, in the present exemplary embodiment, descriptions have been made while exemplifying an aspect in which the equivalent refractive index is set to be "high," "low," and then "high" by narrowing the width of the non-oxidized region 32a in the coupling portion 40. It should be noted that the present invention is not limited thereto. For example, the equivalent refractive index may be set to be "high," "low," and then "high" by providing a groove at a position of the coupling portion 40 (between the light emitting part 50 and the light receiving part 52). A configuration in which the width is decreased and a configuration in which the groove is provided may be combined. In this case, the groove may be filled with a material (e.g., air) having a refractive index lower than that of the semiconductor layer around the groove.

Figure 3A:
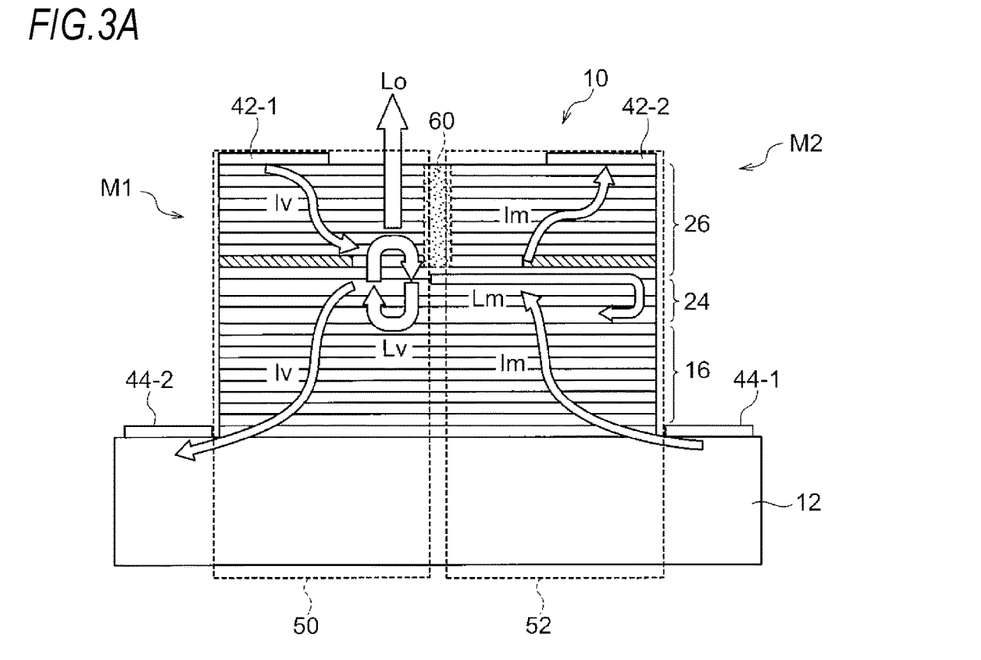
FIGS. 3A and 3B are views for explaining an operation of the light emitting element according to the exemplary embodiment.
Figure 3B:
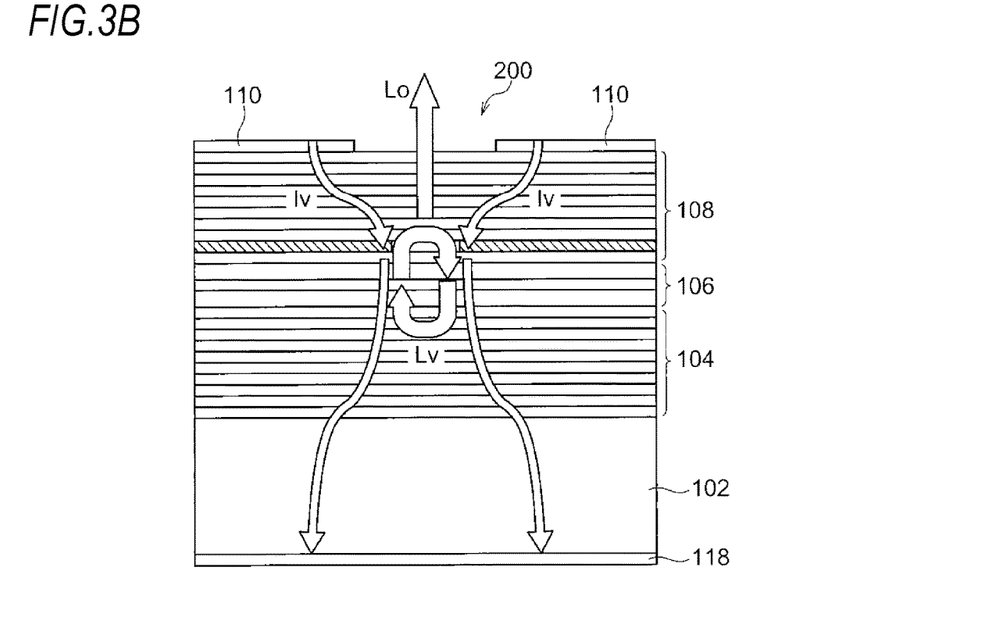

Next, an operation of the light emitting element 10 will be described with reference to FIGS. 3A and 3B. FIG. 3A is a view illustrating a current that flows to the light emitting element 10 according to the present exemplary embodiment, and FIG. 3A schematically illustrates an electrode for intuitive understanding of a flow of the current. That is, as illustrated in FIG. 3A, the p-side electrode pad 42-1 and the n-side electrode pad 44-2 are connected to the light emitting part 50, and the n-side electrode pad 44-1 and the p-side electrode pad 42-2 are connected to the light receiving part 52. FIG. 3B is a view illustrating a current that flows to a typical light emitting element (VCSEL) 200 in the related art illustrated for comparison.

As illustrated in FIG. 3B, the light emitting element 200 in the related art includes a lower DBR 104, an active region 106, an upper DBR 108, and p-side electrode wiring 110 which are formed on a GaAs substrate 102. The light emitting element 200 has a back electrode 118 instead of the n-side electrode pad 44 of the light emitting element 10. When a driving current Iv is applied between the p-side electrode wiring 110 and the back electrode 118 of the light emitting element 200 having the aforementioned configuration, oscillation light Lv is generated, and a part of the oscillation light Lv is projected to the outside as projection light Lo. In the light emitting element 200, a part of the projection light Lo is typically monitored by the monitor PD, and it is impossible to avoid a loss of a part of the projection light Lo in any form.

On the contrary, in the light emitting element 10 according to the present exemplary embodiment, when a positive pole of a power source for the light emitting part 50 is connected to the p-side electrode pad 42-1, a negative pole thereof is connected to the n-side electrode pad 44-2, and a driving current Iv is applied, the oscillation light Lv is generated by the resonator configured with the lower DBR 16 and the upper DBR 26, and a part of the oscillation light Lv is output to the outside as the projection light Lo. Meanwhile, when a positive pole of a power source for the light receiving part 52 is connected to the n-side electrode pad 44-1 and a negative pole thereof is connected to the p-side electrode pad 42-2, propagating light Lm is converted into a monitor current Im. The monitor current Im is converted into voltage by current-voltage conversion, and becomes a feedback signal for the APC control. That is, the monitoring of the optical output from the light emitting element 10 according to the present exemplary embodiment uses a characteristic that the amount of propagating light Lm is proportional to the amount of outgoing light Lo from the light emitting part 50 (VCSEL).

Here, in the light emitting element 10, the propagating light Lm, which is a part of the oscillation light Lv, is directly monitored as described above, so that the projection light Lo from the light emitting part 50 is effectively monitored, but it is desirable that disturbance light be prevented from affecting the light receiving part 52 in order to further improve the characteristic. That is, a unit may be provided to prevent the influence of disturbance light which penetrates from a lateral surface or an upper surface of the mesa M2 of the light receiving part 52 and becomes a noise source when monitoring an optical output by the light receiving part or performing the APC control. The lateral surface of the mesa M of the light emitting element 10 is covered by the interlayer insulating film 34 as described above, but the interlayer insulating film 34 cannot be expected so much from the point of view of removing noise from the received light by the monitor PD. Typically, the refractive index of a dielectric material used for the interlayer insulating film 34 is lower than the refractive index of the semiconductor layer that constitutes the light emitting element 10, and a film thickness thereof is also several hundreds of nanometers (nm) order, and as a result, reflectivity at the surface may be reduced by depositing an insulating film, and may serve to promote the penetration of light into the semiconductor.

Figure 6A:
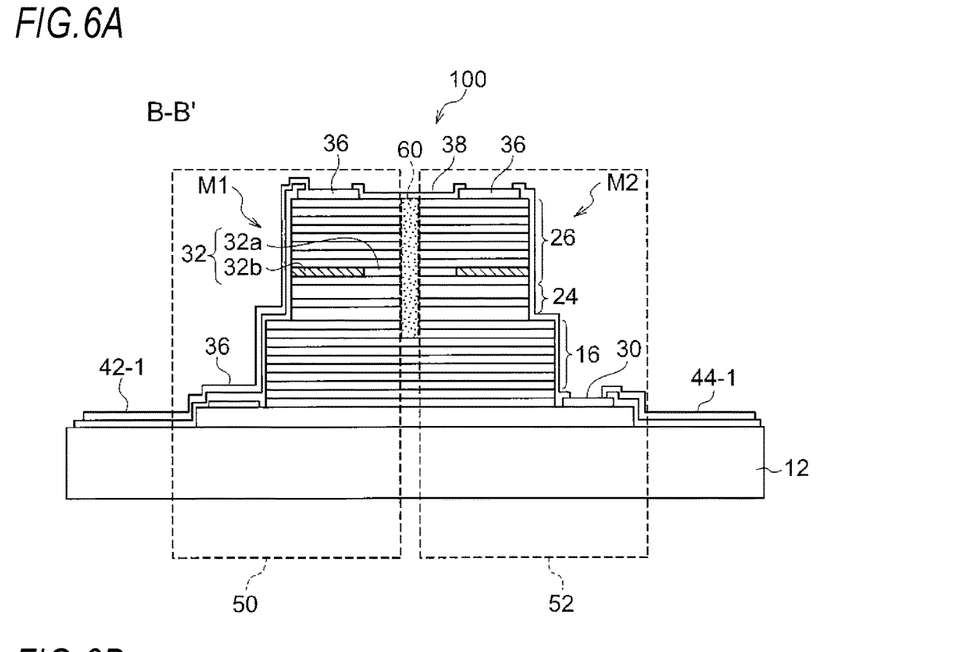
FIGS. 6A and 6B are a cross-sectional view and a top plan view illustrating a configuration of a light emitting element according to a comparative example.
Figure 6B:
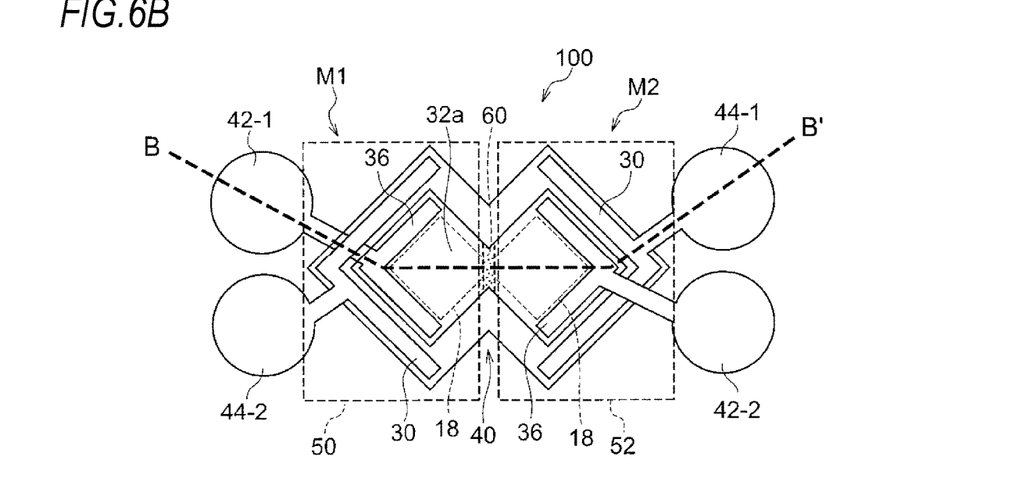

Next, an operation of the light emitting element 10 according to the present exemplary embodiment will be described with reference to FIGS. 1A and 1B and FIGS. 6A and 6B. In order to cope with the aforementioned situations, the light emitting element 10 according to the present exemplary embodiment illustrated in FIGS. 1A and 1B is provided with a light blocking layer to prevent the influence of disturbance light. FIGS. 6A and 6B are views illustrating a light emitting element 100 which does not have a light blocking layer for the purpose of comparison with the light emitting element 10. As illustrated in FIGS. 1A and 1B, in the light emitting element 10, the p-side electrode wiring 36 is formed to cover the lateral surface and the upper surface (light receiving surface) of the mesa M2. More specifically, the p-side electrode wiring 36 on the mesa M2 side is formed as a continuous metal layer that covers the entire upper surface of the mesa M2 and the entire lateral surface from the upper surface of the mesa M2 to a lower side of the active region 24. The p-side electrode wiring 36 is formed on the lateral surface of the mesa M2 with the interlayer insulating film 34 being interposed therebetween, and the p-side electrode wiring 36 is formed on the upper surface of the mesa M2 with the emission surface protective layer 38 being interposed therebetween. The p-side electrode wiring (typically, a metal layer) serves as a light reflection layer that reflects disturbance light, and constitutes the light blocking layer according to the present exemplary embodiment. Meanwhile, the p-side electrode wiring 36 on the mesa M1 side is provided in a V shape in a part of the upper surface of the mesa M1, and formed as a wiring having a constant width from the upper surface of the mesa M1 to the p-side electrode pad 42-1. In other words, by forming the p-side electrode wiring 36 on the mesa M2 side to have a wider width than the p-side electrode wiring 36 on the mesa M1 side, the p-side electrode wiring 36 on the mesa M2 side serves as an effective light reflection layer, compared with a case where the p-side electrode wiring 36 on the mesa M2 side has the same width as the p-side electrode wiring 36 on the mesa M1 side. The "light reflection layer" mentioned in the present exemplary embodiment refers to a layer that, by being added, adjusts, reflectivity on the surface to be higher than reflectivity on the surface in the state where the semiconductor layer of the light emitting element 10 is exposed.

Here, since the active region 24 (quantum layer), which receives the propagating light Lm, is particularly easily affected by disturbance light, at least a part of the active region 24 is necessarily covered by the light reflection layer in the light emitting element 10. As described above, it is not always necessary to cover the entire lateral surface from the upper surface of the mesa M2 to a lower side of the active region 24 with the light reflection layer, but a part of the active region 24 may be covered within the minimum necessary level in consideration of the light receiving sensitivity of the light receiving part 52, the degree of disturbance light, restriction on a layout of the metal layer, and the like. In this respect, as an example, at least ⅓ of the lateral surface of the active region 24 in the mesa M2 may be covered. In a case where ¾ or more of the active region 24 in the mesa M2 is covered, an effect according to the present exemplary embodiment is further efficiently exhibited. On the contrary, in the light emitting element 100 illustrated in FIGS. 6A and 6B which does not have the light blocking layer according to the present exemplary embodiment, a part of the active region 24 on the mesa M2 side is covered by the p-side electrode wiring 36 having a narrow width. However, the covered region is 1/10 or less of the entire lateral surface of the active region 24, and an S/N ratio of the monitor current in the light receiving part 52 deteriorates, compared with a configuration in which at least ⅓ of the active region 24 is covered.

In the light emitting element 10 according to the present exemplary embodiment, descriptions have been made while exemplifying an aspect in which the light reflection layer is used in common with the electrode wiring. It should be noted that the invention is not limited thereto. Alternatively, the lateral surface and the upper surface (light receiving surface) of the mesa M2 may be covered by a metal layer dedicated for the light blocking layer.

In the light emitting element 10 according to the present exemplary embodiment, descriptions have been made while exemplifying an aspect in which the light blocking layer is provided on the lateral surface and the upper surface (light receiving surface) of the mesa M2. It should be noted that the invention is not limited thereto. Alternatively, the light blocking layer may be provided only on the lateral surface of the mesa M2 in consideration of the light receiving sensitivity of the light receiving part 52, the degree of disturbance light, restriction on a layout of the light blocking layer, and the like. In a case where the light blocking layer is provided on the upper surface, the light blocking layer does not always have to be provided on the entire upper surface. The light blocking layer may be provided on a part of the upper surface in consideration of the light receiving sensitivity of the light receiving part 52, the degree of disturbance light, restriction on a layout of the metal layer, and the like. The light blocking layer may also be provided on the lateral surface of the mesa M1 of the light emitting part 50. By providing the light blocking layer on the lateral surface of the mesa M1 of the light emitting part 50 as well, the influence of leaking light, which leaks directly from the light emitting part 50, is also prevented.

<First Modification of First Exemplary Embodiment>

In the exemplary embodiment, a relationship between a wiring width of the p-side electrode wiring 36 on the lateral surface of the light emitting part 50 (mesa M1) and a wiring width of the p-side electrode wiring 36 (light blocking layer) on the lateral surface of the light receiving part 52 (mesa M2) is not particularly limited, but in the present exemplary embodiment, both the wiring widths are different from each other in consideration of a difference in function and characteristic between the light emitting part 50 and the light receiving part 52. That is, in the present exemplary embodiment, the wiring width of the p-side electrode wiring 36 (light blocking layer) on the lateral surface of the light receiving part 52 (mesa M2) is greater than that of the p-side electrode wiring 36 on the lateral surface of the light emitting part 50 (mesa M1). This is because the p-side electrode wiring 36 on the lateral surface of the light receiving part 52 (mesa M2) serves as both a path of current and the light blocking layer, but the p-side electrode wiring 36 on the lateral surface of the light emitting part 50 (mesa M1) serves as only a path of current. Therefore, appropriate wiring widths are determined by a difference in functions and characteristics between the light emitting part 50 and the light receiving part 52, and a wiring material is also effectively used.

<Second Modification of First Exemplary Embodiment>

In the aforementioned exemplary embodiment, descriptions have been made while exemplifying an aspect in which a metal layer is used as the light blocking layer. It should be noted that the invention is not limited thereto. Alternatively, a light blocking layer made of other materials may be used. In the present exemplary embodiment, a dielectric multilayered film (not illustrated) is used as the light blocking layer.

The dielectric multilayered film refers to a stacked body formed by alternately stacking a dielectric thin film having a high refractive index and a dielectric thin film having a low refractive index in a multilayered structure. The dielectric multilayered film is an optical thin film by which various optical properties are obtained. In the present exemplary embodiment, the dielectric multilayered film is configured as a reflector, and disturbance light is reflected by the reflector so that the influence of the disturbance light on the light receiving part 52 is prevented.

For example, the dielectric multilayered film according to the present exemplary embodiment is formed by stacking $TiO_2$ (titanium oxide film) as a material having a high refractive index and a silicon oxide film ($SiO_2$ film) as a material having a low refractive index in a multilayered structure. The dielectric multilayered film according to the present exemplary embodiment may be formed on both the lateral surface and the upper surface of the light receiving part 52 (mesa M2), or only on the lateral surface of the light receiving part 52 (mesa M2). In a case where the dielectric multilayered film is formed on the lateral surface of the mesa M2, the dielectric multilayered film may be formed on the interlayer insulating film 34, or may be formed directly on the lateral surface of the mesa M2. In a case where the dielectric multilayered film is formed on the upper surface of the mesa M2, the dielectric multilayered film may be formed on the emission surface protective layer 38, or may be formed directly on the upper surface (upper DBR 26). The film thickness of the dielectric multilayered film is, for example, 1 μm.

The dielectric multilayered film according to the present exemplary embodiment may be formed to cover at least a part of the lateral surface of the active region 24 in the mesa M2, but like the metal layer according to the exemplary embodiment, the dielectric multilayered film may be configured to cover at least ⅓ of the active region 24 in the mesa M2. In a case where ¾ or more of the active region 24 in the mesa M2 is covered, an effect according to the present exemplary embodiment is further efficiently exhibited. The dielectric multilayered film may also be provided on the lateral surface of the mesa M1 of the light emitting part 50. By providing the dielectric multilayered film on the lateral surface of the mesa M1 of the light emitting part 50 as well, the influence of leaking light, which leaks directly from the light emitting part 50, is prevented.

<Third Modification of First Exemplary Embodiment>

In each of the aforementioned embodiments, descriptions have been made while exemplifying an aspect in which light is blocked by being reflected. It should be noted that the invention is not limited thereto. Alternatively, light may be blocked by being absorbed. Therefore, in the present exemplary embodiment, a light absorbing layer (not illustrated) is provided on the lateral surface or the upper surface of the light receiving part 52 (mesa M2). In a case where the light absorbing layer according to the present exemplary embodiment is formed on the lateral surface of the mesa M2, the light absorbing layer may be formed on the interlayer insulating film 34, or may be formed directly on the lateral surface of the mesa M2. In a case where the dielectric multilayered film is formed on the upper surface of the mesa M2, the dielectric multilayered film may be formed on the emission surface protective layer 38, or may be formed directly on the upper surface (upper DBR 26).

The light absorbing layer according to the present exemplary embodiment may be formed to cover at least a part of the lateral surface of the active region 24 in the mesa M2. Like the light reflection layer according to the exemplary embodiment, the light absorbing layer may be configured to cover at least ⅓ of the active region 24 in the mesa M2. In a case where ¾ or more of the active region 24 in the mesa M2 is covered, an effect according to the present exemplary embodiment is further efficiently exhibited. The light absorbing layer according to the present exemplary embodiment may be formed as a non-translucent resin layer. The thickness of the light absorbing layer may be, for example, 1 μm or more. By the way, the film thickness of the insulating film such as the interlayer insulating film 34 is typically less than 1 μm, and a translucent material such as a silicon nitride film (SiN film) or a silicon oxynitride film (SiON film) is used. The light absorbing layer may also be provided on the lateral surface of the mesa M1 of the light emitting part 50. By providing the light absorbing layer on the lateral surface of the mesa M1 of the light emitting part 50 as well, the influence of leaking light, which leaks directly from the light emitting part 50, is prevented.

Second Exemplary Embodiment

Figure 4A:
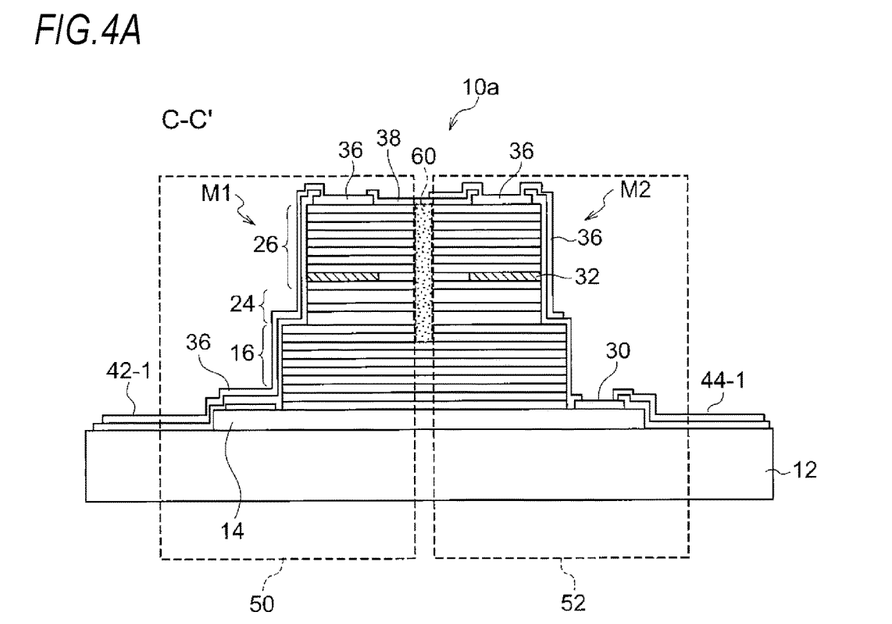
FIGS. 4A and 4B are a cross-sectional view and a top plan view illustrating an exemplary configuration of a light emitting element according to a second exemplary embodiment.
Figure 4B:
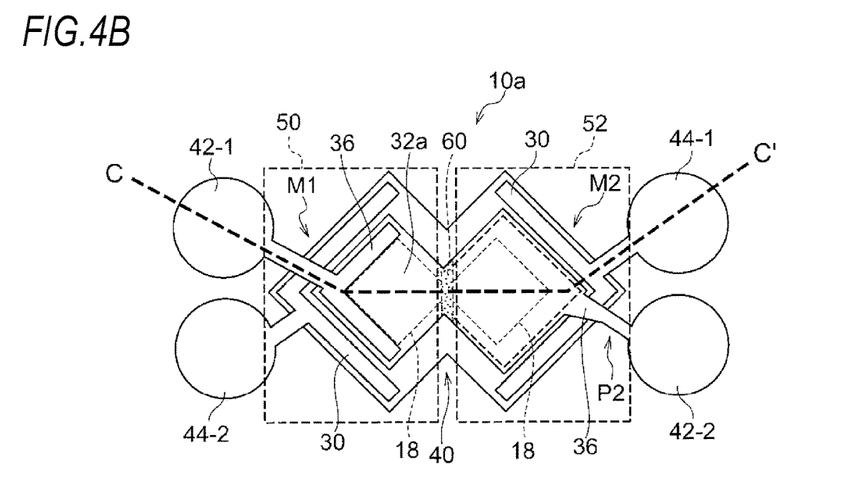

A light emitting element 10*a* according to the present exemplary embodiment will be described with reference to FIGS. 4A and 4B. The light emitting element 10*a* has a configuration in which the shape of the p-side electrode wiring in the light receiving part 52 (mesa M2) is changed in a light emitting element according to each of the aforementioned exemplary embodiments.

In the light emitting element 10, the lead wiring of the n-side electrode pad 42-2, which is indicated by arrow P1 in FIGS. 1A and 1B, has a constant width. On the contrary, in the light emitting element 10*a*, the width of the lead wiring of the n-side electrode pad 42-2 is small (narrow) as indicated by arrow P2 in FIGS. 4A and 4B. By narrowing the lead wiring as described above, the chip size of the light emitting element 10*a* becomes smaller. In the aforementioned exemplary embodiments, descriptions have been made while exemplifying an aspect in which the lead wiring of the n-side electrode pad 42-2 is narrow. It should be noted that the invention is not limited thereto. The lead wiring of another electrode pad may also be narrowed.

Third Exemplary Embodiment

Figure 5:
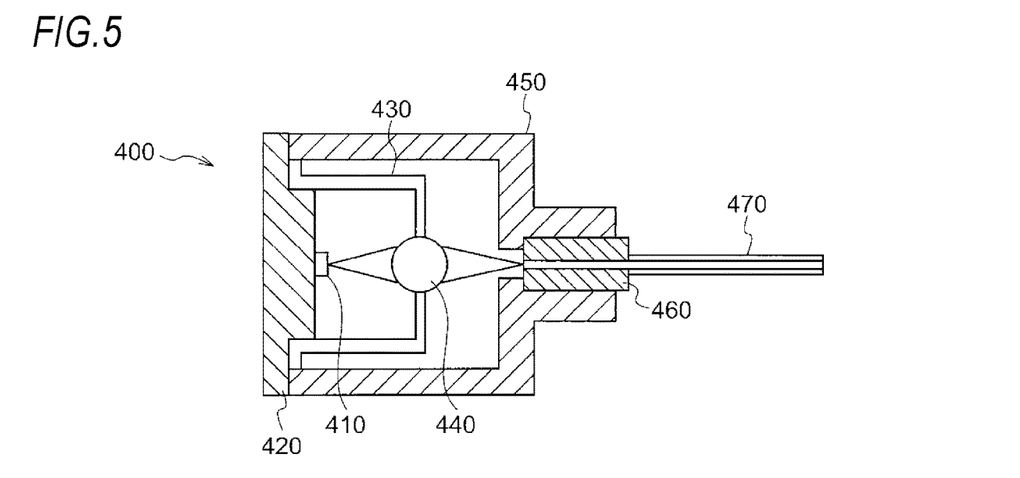
FIG. 5 is a cross-sectional view illustrating an exemplary configuration of a light transmission device according to a third exemplary embodiment.

A light transmission device according to the present exemplary embodiment will be described with reference to FIG. 5. FIG. 5 is a cross-sectional view illustrating an exemplary configuration of a light transmission device 400 according to the present exemplary embodiment. The light transmission device 400 includes a metal stem 420 on which an electronic component 410 having the light emitting element 10 is mounted. The stem 420 is covered by a hollow cap 430, and a ball lens 440 is fixed at the center of the cap 430. A cylindrical housing 450 is attached to the stem 420, and an optical fiber 470 is fixed to an end portion of the housing 450 through a ferrule 460. In the electronic component 410, the light emitting element 10 is operated by a drive unit (not illustrated), and projects projection light Lo. The projection light Lo projected from the electronic component 410 is condensed by the ball lens 440, and the condensed light is incident on the optical fiber 470 to be transmitted. Other lenses such as a biconvex lens and a planoconvex lens may be used in addition to the ball lens.

In each of the aforementioned exemplary embodiments, descriptions have been made while exemplifying an aspect in which the light blocking layer is provided on the lateral surface of the upper DBR 26 including the quantum layer. It should be noted that the invention is not limited thereto. The light blocking layer may be provided to cover the lower DBR 16 as well.

In addition, in each of the aforementioned exemplary embodiments, descriptions have been made while exemplifying a single light emitting element. It should be noted that the invention is not limited thereto. Alternatively, a light emitting element array having plural light emitting elements according to each of the exemplary embodiments formed on a single substrate may also be adopted. According to the light emitting element array formed by using the light emitting elements according to each of the exemplary embodiments, projection light from the light emitting part of another light emitting element is prevented from entering, as leaking light, a light receiving part of a certain light emitting element.

In the aforementioned exemplary embodiments, descriptions have been made while exemplifying a GaAs-based light emitting element using a semi-insulating GaAs substrate. It should be noted that the invention is not limited thereto. Alternatively, a GaN (gallium nitride) substrate or an InP (indium phosphide) substrate may be used.

Further, in the aforementioned exemplary embodiments, descriptions have been made while exemplifying an aspect in which the n-type contact layer is formed on the substrate. It should be noted that the invention is not limited thereto. Alternatively, a p-type contact layer may be formed on the substrate. In this case, in the aforementioned description, the n-type and the p-type may be reversely read.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element comprising:
a semiconductor stack structure including:
a light emitting part; and
a light receiving part configured to receive light propagating in a lateral direction through a semiconductor layer from the light emitting part,
wherein the light receiving part is configured to convert a received light into a detected monitor current, and
wherein the light emitting part and the light receiving part share a quantum layer; and
a light reflection layer that covers ⅓ or more of a lateral surface of the quantum layer in the light receiving part.

2. The light emitting element according to claim 1, wherein the light reflection layer is a metal layer.

3. The light emitting element according to claim 2, wherein the metal layer is an electrode wiring.

4. The light emitting element according to claim 1, wherein the light reflection layer covers ¾ or more of the lateral surface of the quantum layer.

5. The light emitting element according to claim 1, wherein the light reflection layer further covers a light receiving surface of the light receiving part.

6. A light transmission device comprising:
the light emitting element according to claim 1; and
an applying unit configured to apply a driving signal to the light emitting element.

7. A light emitting element array comprising:
a plurality of the light emitting elements according to claim 1.

8. The light emitting element according to claim 1, wherein the light receiving part comprises a monitor photodiode.

9. The light emitting element according to claim 1, wherein the light emitting element is configured to compare the detected monitor current with a reference value to perform feedback control on the light emitting part.

10. The light emitting element according to claim 1, wherein the light reflection layer directly covers ⅓ or more of the lateral surface of the quantum layer in the light receiving part.

11. The light emitting element according to claim 1, wherein the light reflection layer directly covers ⅓ or more of the lateral surface of the quantum layer in the light receiving part.

12. The light emitting element according to claim 1, wherein the light reflection layer contacts ⅓ or more of the lateral surface of the quantum layer in the light receiving part.

13. The light emitting element according to claim 1, wherein the light reflection layer is configured to adjust reflectivity on the ⅓ or more of the lateral surface of the quantum layer in the light receiving part.

14. The light emitting element according to claim 1, wherein the light reflection layer overlaps with the ⅓ or more of the lateral surface of the quantum layer in the light receiving part when viewed from the lateral direction.

15. A light emitting element comprising:
   a semiconductor stack structure including:
      a light emitting part; and
      a light receiving part configured to receive light propagating in a lateral direction through a semiconductor layer from the light emitting part, wherein the light receiving part is configured to convert a received light into a detected monitor current, wherein the light emitting part and the light receiving part share a quantum layer;
   a first electrode wiring that is formed on a lateral surface of the light emitting part; and
   a second electrode wiring that is formed on a lateral surface of the light receiving part and that has a wider width than the first electrode wiring.

16. A light emitting element comprising:
   a semiconductor stack structure including:
      a light emitting part, and
      a light receiving part configured to receive light propagating in a lateral direction through a semiconductor layer from the light emitting part, wherein the light receiving part is configured to convert a received light into a detected monitor current, wherein the light emitting part and the light receiving part share a quantum layer; and
   a light blocking layer configured to block light by absorbing the light from outside, that is provided on at least a part of a lateral surface of the quantum layer in the light receiving part, and that has a thickness of 1 μm or more.

17. The light emitting element according to claim 16, wherein the light blocking layer covers ¾ or more of the lateral surface of the quantum layer.

18. The light emitting element according to claim 16, wherein the light blocking layer further covers a light receiving surface of the light receiving part.

* * * * *